United States Patent [19]

Abe et al.

[11] Patent Number: 4,975,847
[45] Date of Patent: Dec. 4, 1990

[54] DIAGNOSIS SYSTEM FOR A MOTOR VEHICLE

[75] Inventors: Kunihiro Abe; Tomoya Kobayashi, both of Tokyo, Japan

[73] Assignee: Fuji Jukogyo Kabushiki Kaisha, Tokyo, Japan

[21] Appl. No.: 445,894

[22] Filed: Dec. 1, 1989

Related U.S. Application Data

[63] Continuation of Ser. No. 255,555, Oct. 7, 1988, abandoned.

[30] Foreign Application Priority Data

Oct. 9, 1987 [JP] Japan ................................. 62-255911
Nov. 16, 1987 [JP] Japan ................................ 62-290206

[51] Int. Cl.$^5$ ........................ G01M 15/00; G06F 15/20
[52] U.S. Cl. ........................... 364/424.03; 364/551.01; 73/116; 73/118.1; 371/16.4
[58] Field of Search .................... 364/431.03, 431.12, 364/424.03, 424.04, 551.01, 570; 73/116, 118.1; 340/52 R, 52 F, 534; 371/15, 20; 324/73 R, 73 AT

[56] References Cited

U.S. PATENT DOCUMENTS

| 4,234,921 | 11/1980 | Kinoshita et al. | 364/900 X |
| 4,375,672 | 3/1983 | Kato et al. | 73/117.2 |
| 4,476,531 | 10/1984 | Marino et al. | 364/431.01 |
| 4,694,408 | 9/1987 | Zaleski | 371/20 |
| 4,748,843 | 6/1988 | Schafer et al. | 73/117.3 |
| 4,757,463 | 7/1988 | Ballou et al. | 364/551.01 |

FOREIGN PATENT DOCUMENTS 58-12848 1/1983 Japan.

Primary Examiner—Parshotam S. Lall
Assistant Examiner—V. Trans
Attorney, Agent, or Firm—Martin A. Farber

[57] ABSTRACT

A diagnosis device is provided for diagnosing an electronic control system for controlling an automotive engine mounted on a motor vehicle. A memory in a computer provided in the diagnosis device stores a plurality of programs for diagnosing the electronic control system. The diagnosis device is connected to the electronic control system by a harness including a power line for supplying power from a battery mounted on the motor vehicle and communication lines for data communication between the device and the system.

10 Claims, 6 Drawing Sheets

DIAGNOSIS SYSTEM FOR A MOTOR VEHICLE

RELATED APPLICATION

This application is a continuation of our co-pending application Ser. No. 07/255,555 filed Oct. 7, 1988 now abandoned.

BACKGROUND OF THE INVENTION

The present invention relates to a diagnosis system for a motor vehicle.

Recently, a motor vehicle is equipped with an electronic control system for controlling various components of an engine, such as fuel injectors, thereby improving driveability, exhaust gas emission, fuel consumption, and engine power. The electronic control system controls the components based on information represented by output signals from various sensors for detecting engine operating conditions. Accordingly, if malfunctions of components and sensors occur, the engine does not properly operate.

However, because of complexity of the electronic control system, it is difficult to immediately find out the trouble. Accordingly, a trouble diagnosis device, particularly a portable diagnosis device for easily checking the electronic control system should be provided as equipment in an auto shop.

Japanese Patent Application Laid-Open No. 58-12848 discloses a diagnosis system in which an exclusive checking device is provided for measuring a pulse duration of fuel injection and an engine speed, and for checking whether idling speed is normal. The checking device is provided for diagnosing only designated specific types of motor vehicles.

There are two types of portable diagnosis devices. One of the devices has a power source for operating the device provided therein, and the other device is supplied with a power from a battery mounted in the automobile through an external connecting member such as a cigaret lighter socket.

The device having the power source therein becomes large in size and heavy in weight, which causes reduction of operability. On the other hand, in use of the device supplied with power from the external power source, first connectors for the power source and second connectors for the data communication must be separately connected, which requires troublesome connecting operations.

SUMMARY OF THE INVENTION

The object of the present invention is to provide a diagnosis system which is compact in size and has an excellent operability.

The other objects and features of this invention will become understood from the following description with reference to the accompanying drawings.

DETAILED DESCRIPTION OF THE PREFERRED EMBODIMENT

Figure 1:
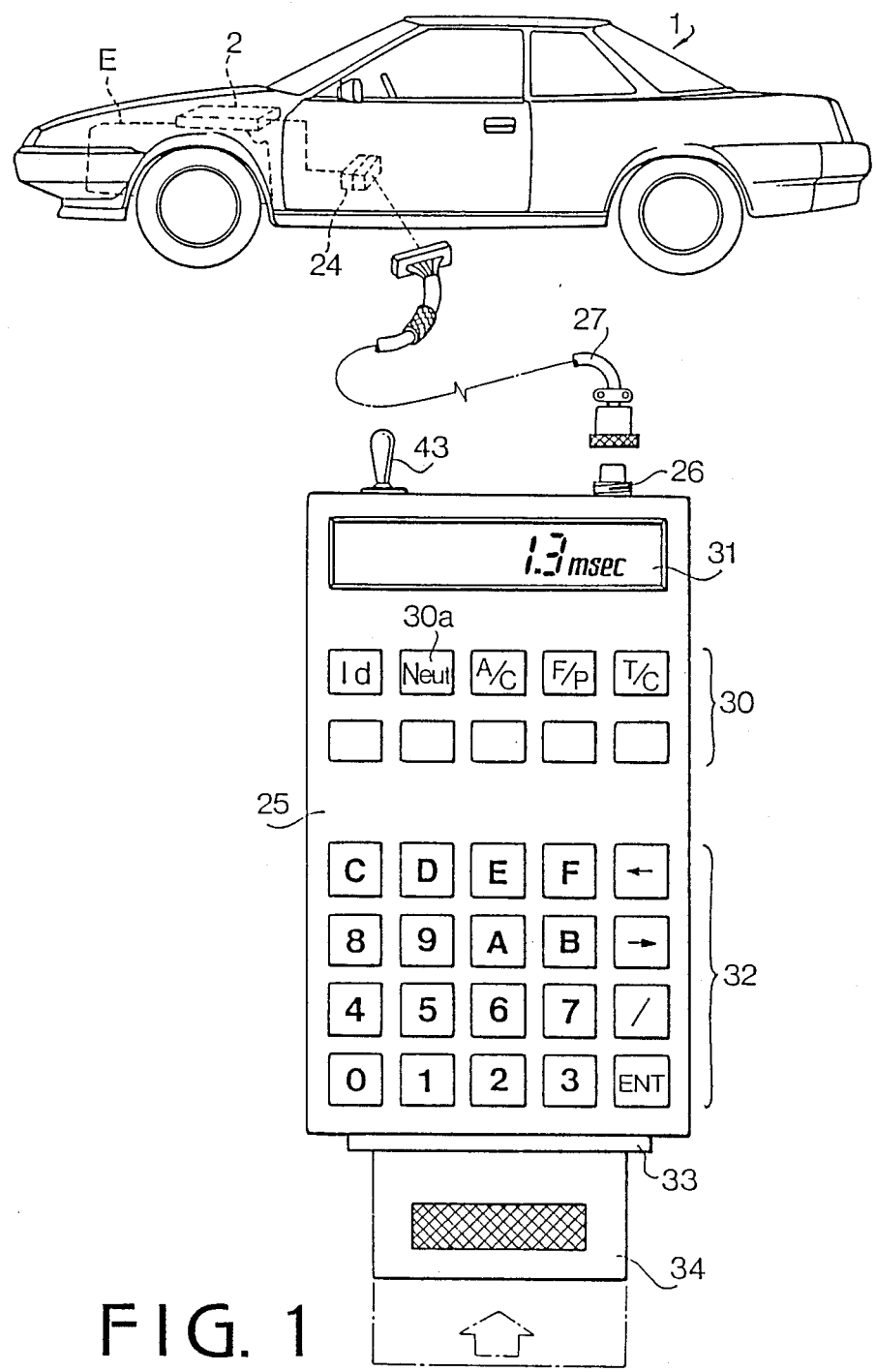
FIG. 1 is a schematic illustration of a diagnosis system according to the present invention.

Referring to FIG. 1, an automobile 1 is equipped with an electronic control system 2 for controlling various components of an engine E. The electronic control system 2 is connected to an external connector 24. A portable diagnosis device 25 comprising a microcomputer has a connector 26, to which the connector 24 of the system 2 is connected through an adapter harness 27.

Figure 2:
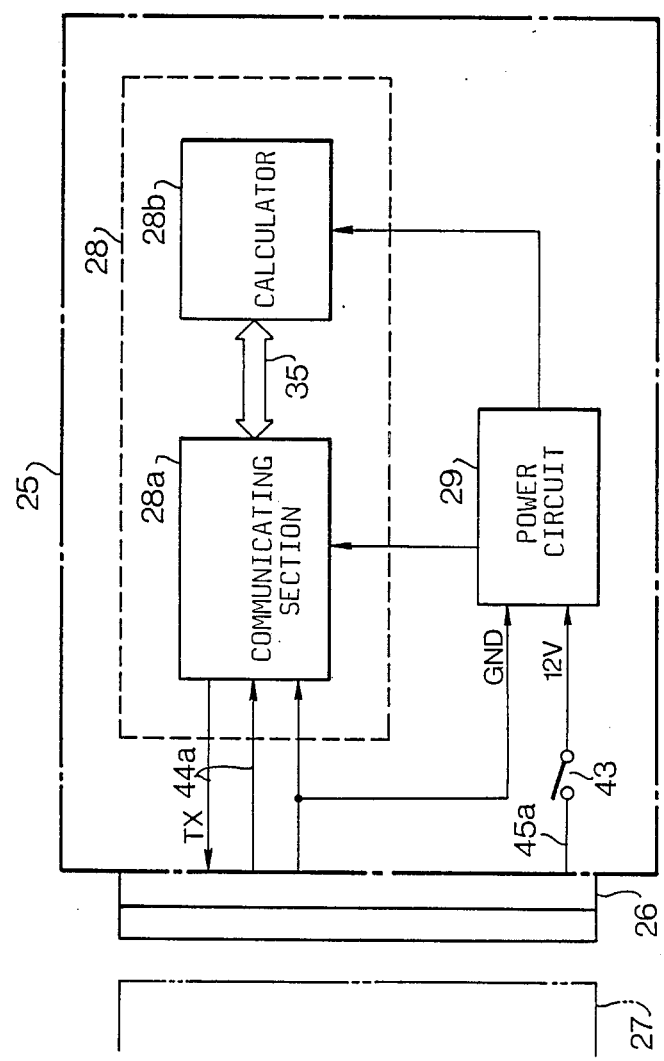
FIG. 2 is a block diagram showing a diagnosis device of the system.

The diagnosis device 25 has a power switch 43, a liquid crystal display 31, an indicator section 30 consisting of a plurality of indicators of LED, and a keyboard 32. A connector 33 is provided for connecting a detachable memory cartridge 34. A plurality of memory cartridges 34 are provided for various types of control systems 2, each having a different program Referring to FIG. 2, the diagnosis device 25 comprises a control unit 28 having a communicating section 28a and a calculator 28b, which are connected to each other through a bus line 35, and a power circuit 29 for supplying a constant voltage to the section 28a and calculator 28b. Inputs of the communicating section 28a and the power circuit 29 are connected to the connector 26 through communicating lines 44a and a power supply line 45a, respectively. The power switch 43 is connected to the line 45a.

Figure 3A:
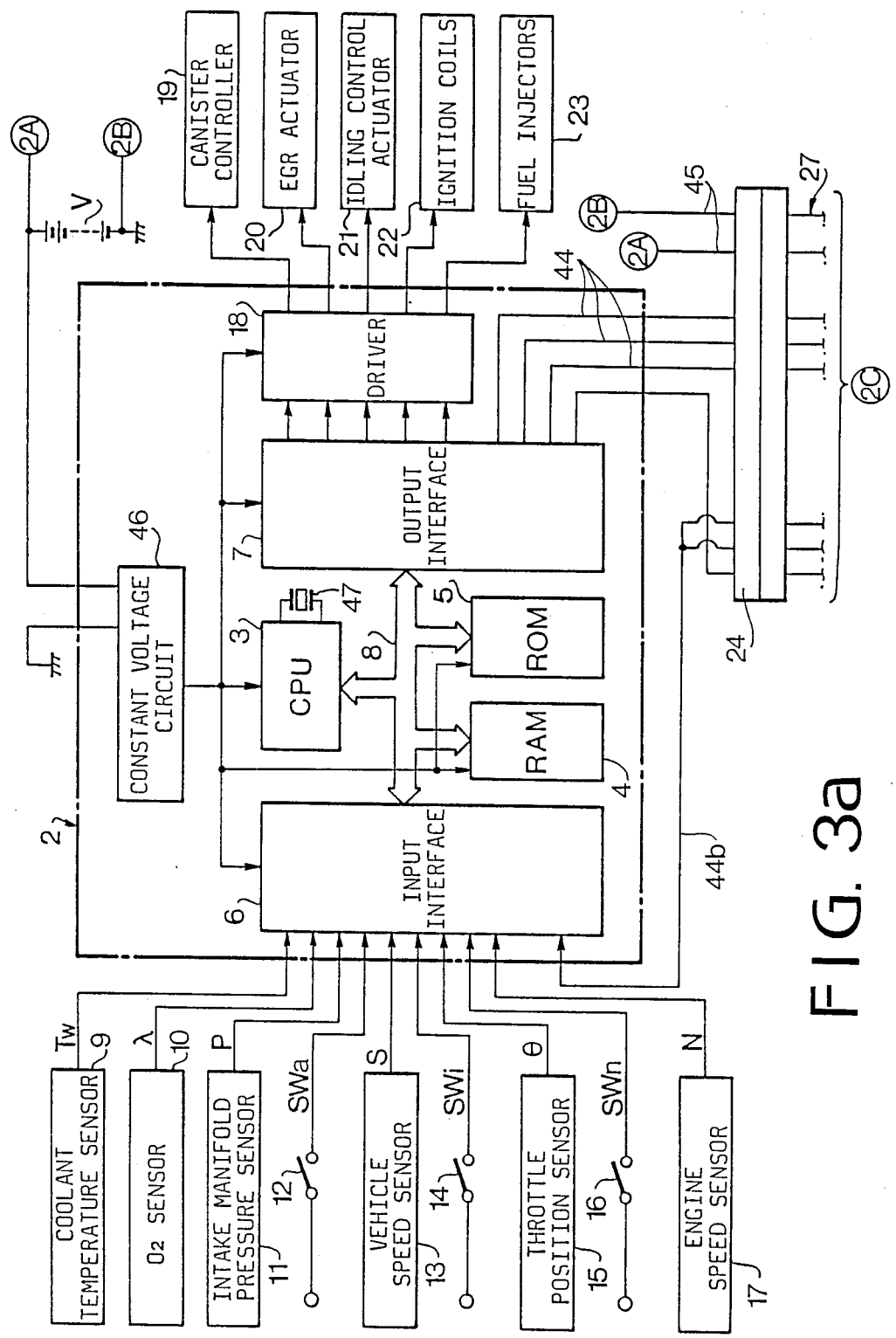
FIGS. 3a and 3b show a block diagram of the diagnosis system and an electronic control system for a motor vehicle.
Figure 3B:
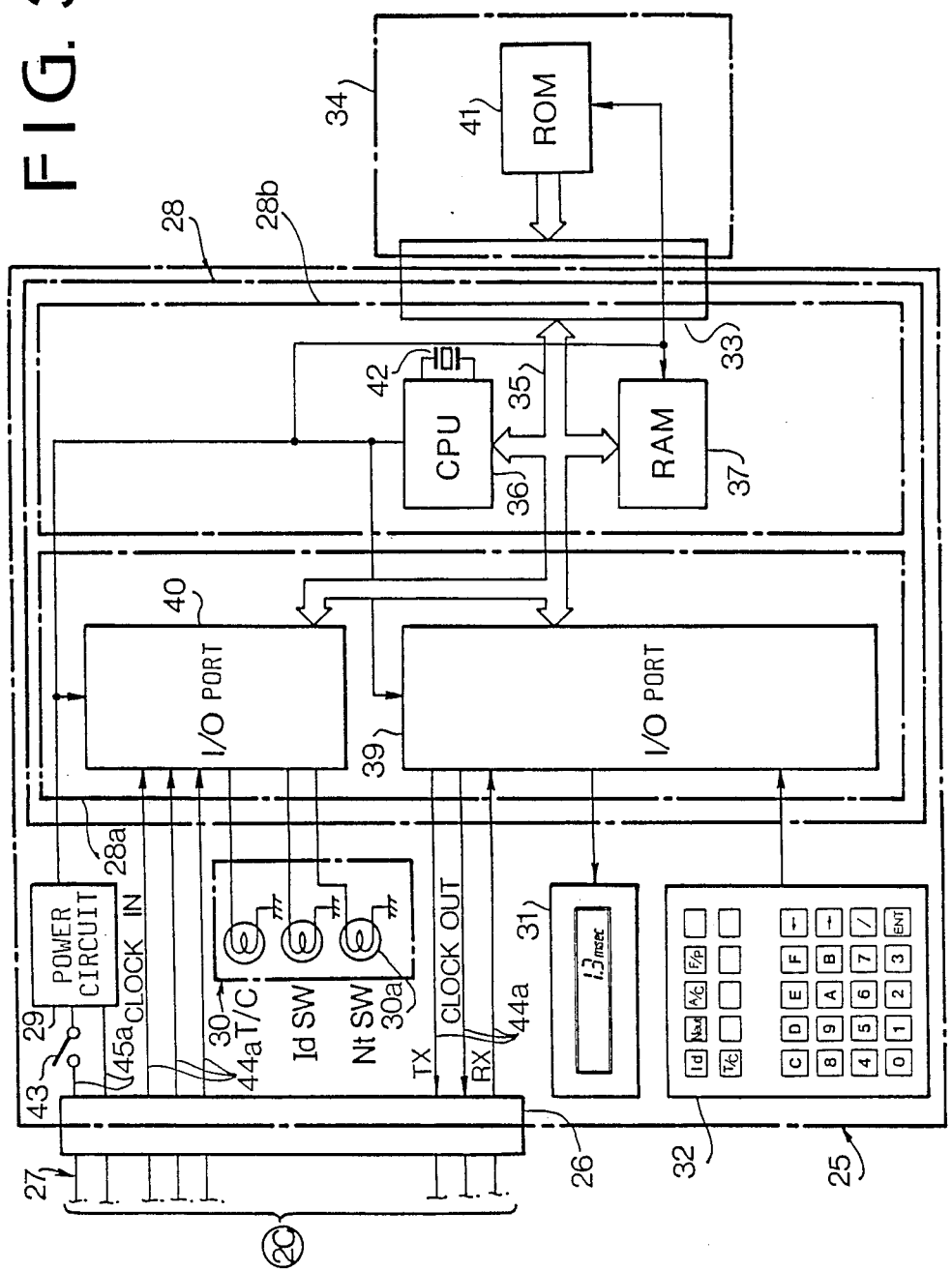

Referring to FIGS. 3a and 3b, the electronic control system 2 comprises a central processor unit (CPU) 3, a random access memory (RAM) 4, a read only memory (ROM) 5, an input interface 6 and an output interface 7. The CPU 3, RAM 4, ROM 5, and input and output interfaces 6 and 7 are connected to each other through a bus line 8. A clock pulse generator 47 is connected to the CPU 3, for generating clock pulses. Programs and data for controlling the engine are stored in the ROM 5. Further, an identification code for identifying the type of the communication system of the control system 2 is stored in the ROM 5. Power is supplied to the CPU 3, RAM 4, ROM 5, input and output interfaces 6 and 7, and driver 18 from a battery V of the automobile 1 through a constant voltage circuit 46.

The input interface 6 is applied with a coolant temperature signal Tw from a coolant temperature sensor 9, an air-fuel ratio feedback signal + from an O$_2$ sensor 10, an intake-air pressure signal P from an intake manifold pressure sensor 11, an air conditioner operating signal SWa from an air conditioner switch 12, a vehicle speed signal S from a vehicle speed sensor 13, an idling signal SWi from an idle switch 14, a throttle valve opening degree signal $\theta$ from a throttle position sensor 15, a neutral positioning signal SWn from a neutral switch 16 in a transmission, and an engine speed signal N from an engine speed sensor 17. These signals are stored in the RAM 4 after data processings in accordance with the program stored in the ROM 5. The CPU 3 produces respective control signals, which are applied to the driver 18 through the output interface 7. The driver 18 produces signals for controlling a canister controller 19 of a fuel-vapor emission control system, an EGR (exhaust gas recirculation system) actuator 20, an idling control actuator 21, ignition coils 22, and fuel injectors 23.

The diagnosis device 25 has the control unit 28 and power supply circuit 29. The control unit 28 comprises a CPU 36, a RAM 37, and input/output (I/O) ports 39 and 40. These elements are connected to each other through a bus line 35. A clock pulse generator 42 is provided for generating clock pulses. A ROM 41 provided in memory cartridge 34 is connected to the bus line 35 through the connector 33. The ROM 41 stores a plurality of programs for diagnosing the control system 2. Inputs of the I/O port 40 are connected to the output interface 7 of the control system 2 through communicating lines 44a, connector 26, harness 27, connector 24 and lines 44 so as to receive output signals of the sensors and switches 9 to 17. Outputs of the I/O port 40 are connected to the indicator section 30. Inputs of the I/O port 39 are connected to the keyboard 32 for application with a mode select signal dependent on the operation of the keyboard, and to the output interface 7. Outputs of the I/O port 39 are connected to the input interface 6 through a line 44b and to the display 31. The power circuit 29 for supplying the power to the CPU 36, RAM 37, ROM 41, and I/O ports 39 and 40 is connected to the battery V through the power switch 43, line 45a, harness 27 and lines 45.

Figure 4:
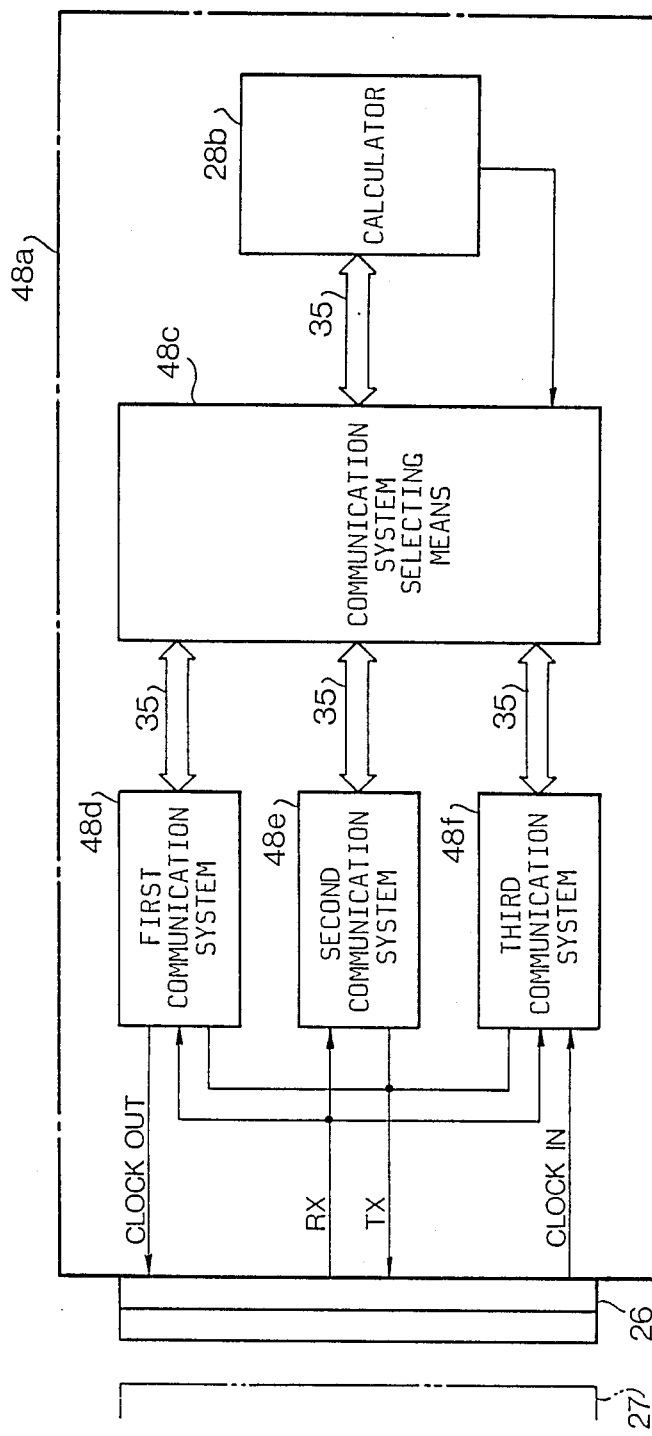
FIG. 4 is a block diagram showing a part of the diagnosis device.

Referring to FIG. 4, a communication system selecting section 48a is provided in the control unit 28. The section 48a has calculator 28b, communication system selecting means 48c, first, second and third communication systems 48d, 48e and 48f which are connected by bus line 35.

The first communication system 48d is provided for the control system 2 which may be synchronized with inside clock pulses. When the first communication system is selected, the control unit 28 applies clock pulses from the clock pulse generator 42 to the control system 2, thereby receiving data signals from the system 2, synchronizing with the pulses.

The second communication system 48e is provided for receiving data signals by the start-stop system.

The third communication system 48f is provided for the control system 2 having the clock pulse generator 47, for receiving data signals in synchronism with clock pulses in the control system 2.

The calculator 28b reads an identification code stored in the ROM 41 of the connected cartridge 34 and produces a system selection signal which is applied to the communication system selecting means 48c. In response to the system selection signal, the system selecting means 48c selects one of the communication systems 48d to 48f.

Before performing the diagnosis program, the identification code of the electronic control system 2 is confirmed and the corresponding cartridge 34 is selected. The control system 2 is connected to the diagnosis device 25 through the connectors 24, 26 and harness 27 and cartridge 34 is attached to the diagnosis device 25.

Figure 5:
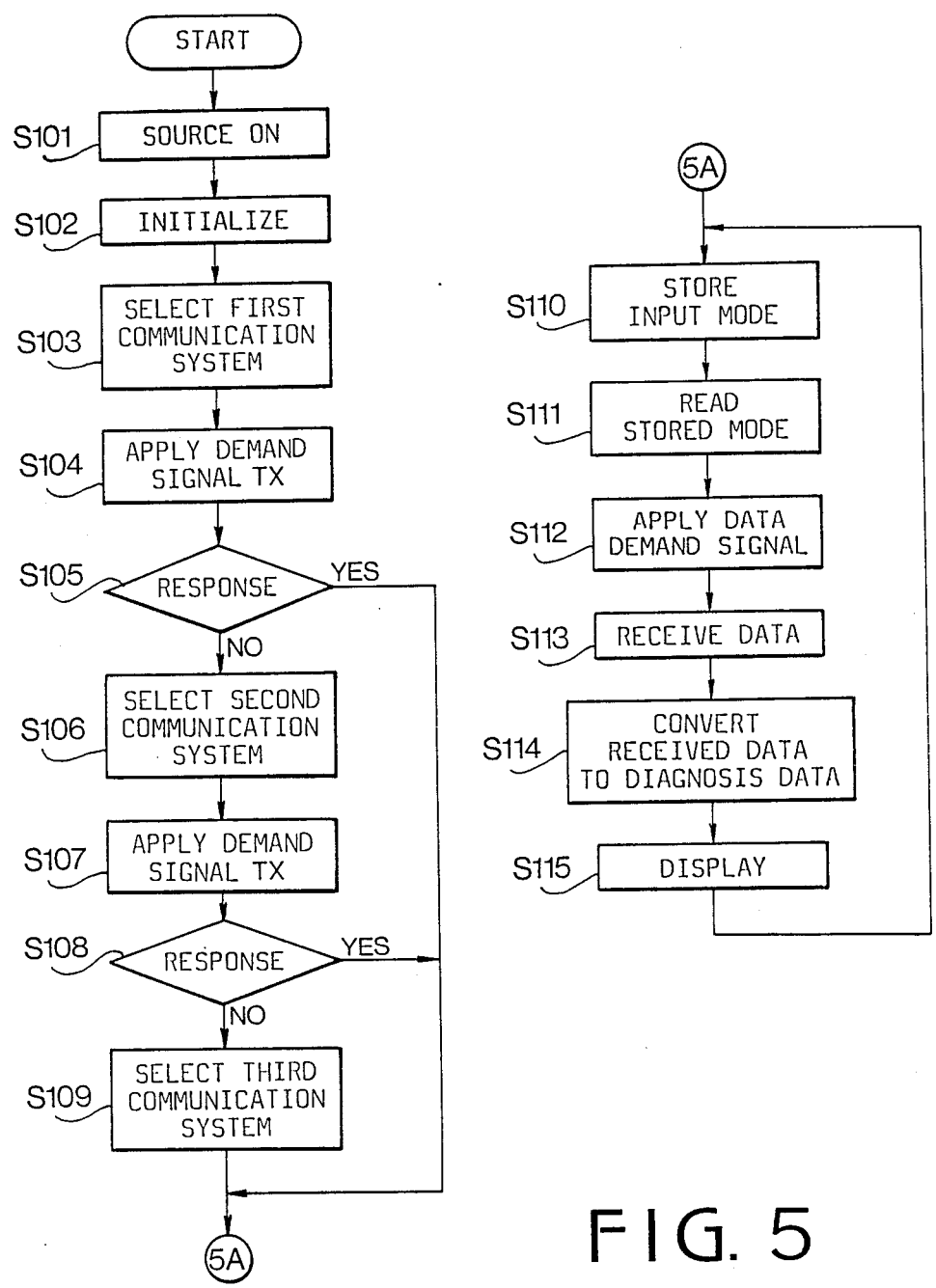
FIG. 5 is a flowchart showing an operation of the system.

The operation of the system is described hereinafter with reference to the flowchart of FIG. 5. The engine is started, and the following diagnosis program is performed with the engine running.

The power switch 43 is turned on at a step S101. At a step S102, initialization of the control unit 28 is performed. At a step S103, the communication system selecting means 48c selects the first communication system 48d. At a step S104, the first communication system 48d operates to produce a synchronizing pulse signal from the clock pulse generator 42 and an information demand signal TX for receiving the identification code stored in the ROM 5, and both signals are applied to the control system 2. At a step S105, it is determined whether the control system 2 responds to the demand signal TX or not. If the control system 2 has the first communication system, a response is sent to the diagnosis device 25, so that the system is fixed to the first communication system 48d, and the program proceeds to a step S110. If the control system 2 makes no response, the program goes to a step S106, where the second communication system 48e is selected by the selecting means 48c. At a step S107, the second communication system 48e operates to produce a demand signal TX for the second communication system which is applied to the control system 2. At a step S108, it is determined whether the control system 2 responds to the demand signal TX. If a response is sent to the diagnosis device 25, the program proceeds to the step S110. If no response is made, the program proceeds to a step S109, where the third communication system 48f is selected and a demand signal TX for the third communication system is fed to the control system 2.

In the embodiment shown in FIGS. 3a and 3b, since the control system 2 has the clock pulse generator 47, the communication system is the third communication system. Accordingly, the bidirectional communication is performed by the third communication system 48f.

Thus, after step S110, a diagnosis routine is performed in accordance with a normal program.

At step S110, a diagnostician operates the keyboard 32 to perform the diagnosis of the engine. For example, when the injection pulse width is confirmed, a mode code or mark for the pulse width (for example F→1→2→ENT) is input by operating the keyboard 32, and the mode code is stored in the RAM 37.

At step S111, the stored mode is read by the control unit 28. At a step S112, a corresponding data demand signal TX is applied to the system 2. At a step S113, a data signal RX representing a fuel injection pulse width is applied to the unit 28 from the control system 2 through the selected communication system. At a step S114, the received binary digit is converted into decimal digit representing the pulse width. At a step S115, a pulse width, for example, 1.3 msec is displayed on the display 31. Thus, the diagnostician can diagnose the item about the fuel injection pulse width.

In order to perform other diagnosis items, the keyboard operation is performed and operations after step S110 are repeated.

Since output signals of the sensors and switches are applied to the indicator section 30 of diagnosis device 25 through the harness 27, corresponding indicators of the section 30 are turned on or off. For example, if a shift lever of the transmission of the motor vehicle is shifted to the neutral position, a neutral indicator 30a is turned on. If the shift lever is at a position other than the neutral position, the neutral indicator is turned off. Accordingly, if the indicator 30a is turned on when the shift lever is at another position, it is determined that the neutral switch 16 is out of order.

In accordance with the present invention, the diagnosis is device is connected to the control system 2 and the battery V mounted on the automobile 1 through communicating and power lines 44a and 45a, connector 26, and harness 27. Therefore, the device 25 becomes compact in size and light in weight. Further, the control system 2 has only one connector 24 and the diagnosis device 25 is connected through the connector 24. Accordingly, the device can be held by one hand.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A single diagnosis system for diagnosing various types of electronic control systems which are different in systems of communication for automotive engines mounted on different vehicles, said electronic control systems having sensing means for detecting operating conditions of the engines and control means for storing input data from said sensing means and providing output data for controlling the engines said single diagnosis system comprising
   a control unit responsive to said output data for diagnosing said output data and for providing diagnosis data,
   display means for displaying said diagnosis data,
   a keyboard for inputting a diagnosis mode into said control unit,
   connecting means for connecting said control unit with said electronic control system if a vehicle to be diagnosed,
   a plurality of detachable memory cartridges selectively detachably connected to said control unit for storing a plurality of programs for diagnosing said output data;
   a plurality of communication systems for the various types of electronic control systems, respectively, which are different in systems of communication provided in said control unit for transmitting said output data comprising different data signals from said electronic control systems to a connected said detachable memory cartridge; and
   selecting means in said control unit for automatically selecting one of said communication systems in dependency on said data signals so as to prevent reduction of operability and troublesome connecting operation.

2. The diagnosis system according to claim 1, wherein
   said different data signals comprise clock pulses.

3. The diagnosis system according to claim 1, wherein
   said different data signals comprise start-stop data signals.

4. The diagnosis system according to claim 1, wherein
   one of the communication systems has a clock pulse generator for receiving said data signals in synchronism with clock pulses in said electronic control system.

5. The diagnosis system according to claim 1, wherein
   said selecting means further selects said one of said communication systems corresponding to said connected detachable memory cartridge.

6. The diagnosis system according to claim 5, wherein
   said connected detachable memory cartridge stores an identifications code corresponding to one of said communicating systems, and
   calculator means in said control unit for reading said identification code and producing a system selection signal which is applied to said selecting means, whereby said selecting means selects the corresponding said one communication system.

7. The diagnosis system according to claim 6, wherein
   said data signals include an identifying code stored in said electronic control system, said selecting means in response to said identifying code selects said one communication system corresponding to said identifying code.

8. The diagnosis system as set forth in claim 1, wherein
   each of the various types of electronic control systems for automotive engines is mounted on a different vehicle, respectively, and
   said diagnosis means by said plurality of communication systems and said selecting means selects a different said selected one communication system of the plurality of communication systems for each different of the various types of electronic control systems in the different vehicles, respectively.

9. A single diagnosis system for various types of electronic control systems for automotive engines mounted on different vehicles, said electronic control systems having sensing means for detecting operating conditions of the engines, means for storing input data from said sensing means and providing output data for controlling the engines, the single diagnosis system comprising
   diagnosis means having a control unit responsive to said output data for diagnosing said output data and for providing diagnosis data,
   a detachable memory cartridge detachably connected to said diagnosis means for storing a plurality of programs for diagnosing said output data,
   display means for displaying said diagnosis data,
   a keyboard for inputting a diagnosis mode into said control unit,
   connecting means for connecting said diagnosis means with the electronic control system of a vehicle to be diagnosed,
   a plurality of communication systems for the various type of electronic control systems, respectively, which are different in systems of communication provided in said diagnosis means for selectively transmitting said output data between the electronic control system of the vehicle to be diagnosed and said detachable memory cartridge when said control system responds to an information demand signal from a selected of said communication systems corresponding to said electronic control system of the vehicle to be diagnosed,
   selecting means for automatically selecting one of said communication systems one by one after inputting said diagnosis mode by said keyboard into said control unit, said one of said communicating system for applying its said demand signal to said electronic control system of the vehicle to be diagnosed and if said electronic control system of the vehicle to be diagnosed responds, diagnosis of said electronic control system of the vehicle to be diagnosed is performed through the selected said one communication system by said diagnosis means, so as to be able to perform fast and easy diagnostic operations of the electronic control system of the vehicle to be diagnosed without complicated connecting works of said connecting means.

10. The diagnosis system as set forth in claim 9, wherein
    each of the various types of electronic control systems for automotive engines is mounted on a different vehicle, respectively, and
    said diagnosis means by said plurality of communication systems and said selecting means selects a different said selected one communication system of the plurality of communication systems for each different of the various types of electronic control systems in the different vehicles, respectively.

* * * * *